ACTIVE TIME DELAY DEVICES

Filed Feb. 5, 1962

INVENTOR.
RICHARD W. BRADMILLER
JAMES A. ALMOND
BY Michael A. Sileo Jr.
ATTORNEY United States Patent Office 3,226,567
Patented Dec. 28, 1965

3,226,567
ACTIVE TIME DELAY DEVICES
Richard W. Bradmiller and James A. Almond, Orange County, Fla., assignors to Martin-Marietta Corporation, Middle River, Md., a corporation of Maryland
Filed Feb. 5, 1962, Ser. No. 170,950
6 Claims. (Cl. 307—88.5)

This invention relates to delay devices and more particularly to an active delay device which can be cascaded in a number of different configurations to provide a desired amount of delay.

In many applications it is necessary to provide long delays. Further, it is necessary to insure the accuracy of these long delays quite closely. Passive delay lines have not been entirely suitable for all such applications. These delay lines are quite expensive when it is necessary to provide a long delay of high accuracy.

In addition, the taps of passive delay lines cannot be loaded to provide outputs from a number of the taps without adversely affecting the waveforms of the pulse output.

In order to overcome these difficulties, it is desirable to provide a simple active delay device having a high impedance input and a low impedance output. It is possible to cascade any desired number of these delay devices to provide the desired amount of delay. By cascading a number of active delay devices, the delay can be provided with a high degree of accuracy and at a minimum expense. Outputs can be taken from each of the delay devices without excessively loading the devices and adversely affecting the propagation of a voltage waveform through the cascaded delay system.

Accordingly, it is an object of the present invention to provide an improved active delay line having a high input impedance and a low output impedance and providing an accurate increment of delay for an input pulse.

It is a further object of the present invention to provide an improved delay system including a plurality of cascaded active delay devices, each of which has a low impedance output which can be loaded without adversely affecting the voltage waveform being propagated in the delay system.

It is a further object of the present invention to provide an improved active delay device which can be cascaded to provide a desired amount of delay.

It is a further object of the present invention to provide an improved active delay device utilizing inexpensive components having loose tolerances.

In accordance with one embodiment of the invention, the input of the delay device is to the base of a transistor. This transistor is connected in a configuration that provides unity gain. The collector of this transistor drives a reactive load. Upon the occurrence of an input pulse, the transistor provides substantially all the energy to the reactive load and thereby produces a ringing voltage output across the reactive load. This ringing waveform includes a primary excursion corresponding in time with the input pulse and a secondary excursion of opposite polarity to the primary excursion. This secondary excursion which is delayed slightly in time from the input pulse, provides the output of the delay device. A clipping and blocking diode is connected across the reactive load to clip all further excursions of the same polarity as the primary excursion or discharge or "dump" any remaining energy in the reactive load. A second diode is connected between the reactive load and the output and is poled to block the primary excursion but to pass the secondary excursion to the output as the output pulse.

Figure 1:
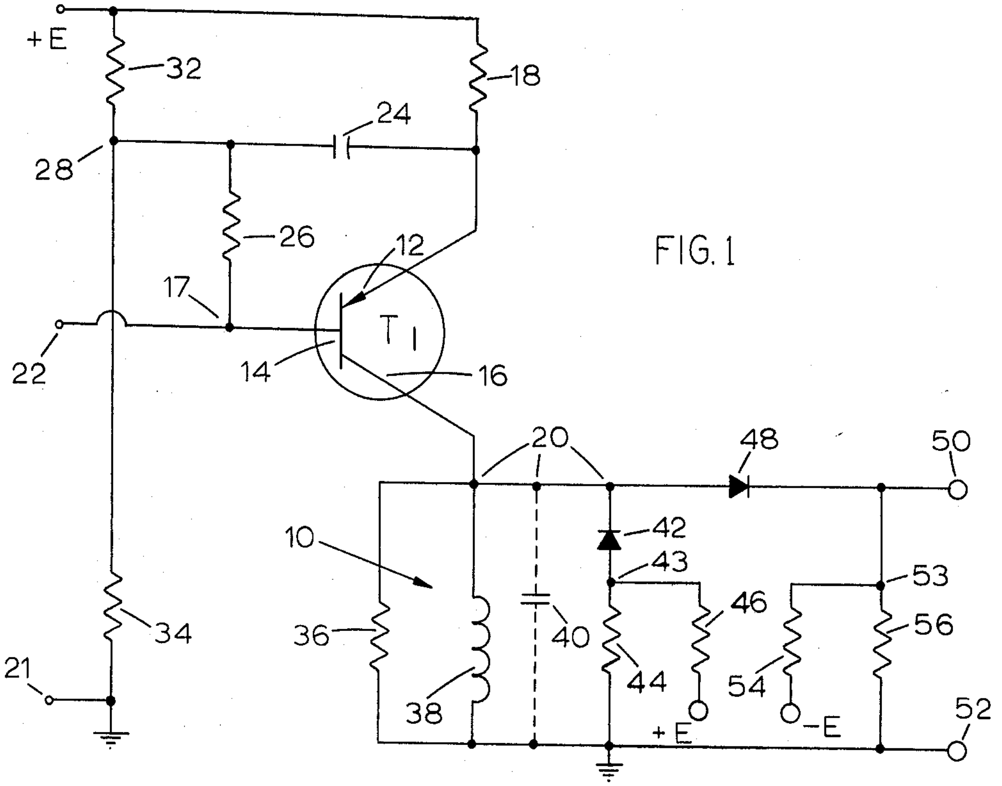
FIGURE 1 shows a circuit diagram of the delay device.
Figure 2:
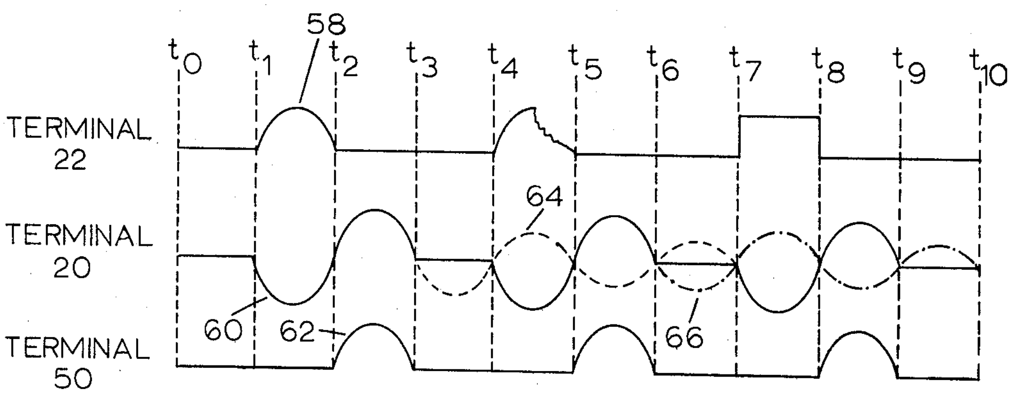
FIGURE 2 shows waveforms of the input signal, the signal across the reactive load, and the output signal.

These and other objects, advantages, and features of the invention will be more apparent from the following detailed description together with the appended claims and drawings in which:

*Detailed description FIGURES 1 and 2*

Referring to the enclosed drawings, FIG. 1 depicts a circuit diagram of the active delay device of the present invention, and FIG. 2 depicts several waveforms present at specific terminals within the circuit of FIG. 1.

A class A, unity gain transistor $T_1$ is provided for supplying energy to the LRC circuit, which circuit is generally indicated at 10. The transistor $T_1$ comprises an emitter 12, base 14, and a collector 16, with the emitter 12 being directly connected to a positive source of potential +E via a resistor 18, the base 14 being directly connected to the input terminal 22, and the collector 16 being directly connected to terminal 20. The emitter 12 of transistor $T_1$ is also connected to base 14 via feedback capacitor 24 and resistor 26. A voltage divider comprising series connected resistors 32 and 34 is connected between the source +E and ground. The junction of capacitor 24 and resistor 26 is directly connected to junction 28 of resistors 32 and 34.

It will be apparent from the foregoing that a positive feedback is provided from the emitter 12 to the base 14 of transistor $T_1$ via the capacitor 24 and the resistor 26. That is to say, conventionally any signal present at input terminals 21–22 and consequently directly coupled to base 14 of transistor $T_1$ will appear, substantially equal in both phase and amplitude, at the emitter 12 of the transistor $T_1$, and if this signal on the emitter 12 is capacitively fed back to the terminal 28 on the bias network 32–34, as is the case here, it will cause relatively low or insignificant signal current to flow through the resistor 26, which resistor connects the base 14 of transistor $T_1$ to the junction terminal 28 of the bias network 32–34. It will be further apparent that since the transistor $T_1$ is conventionally connected in a unity gain configuration, the positive feedback from emitter 12 to base 14 must be less than unity, and thereby provide the above-mentioned minimum A.C. current flow through the resistor 26 when an input signal is coupled to terminal 22. This accordingly results in a high input impedance for the transistor circuit which is dependent primarily upon emitter degeneration. This advantageously causes the shunt loading effect of the bias network 32–34 to be substantially eliminated. To state it further, the base 14 of transistor $T_1$, as a result of the capacitively coupled feed back of signals present on the emitter 12 of transistor $T_1$ to the junction terminal 28 effectively unloads the base 14 of transistor $T_1$ and advantageously results in the base 14 seeing virtually a high impedance path to the bias source or junction 28 of the bias network 32–34, and consequently the input signal applied at terminal 22 will also see a very high impedance. It should be noted that the biasing network and the emitter-base feedback arrangements per se of the circuit of FIG. 1 are conventional and are not a part of this invention. Accordingly, any other well known biasing network for providing a high impedance input to the transistor $T_1$ may be incorporated without departing from the spirit and scope of the present invention.

The collector 16 of transistor $T_1$ is also connected to the LRC network 10. The LRC network 10 comprises a resistor 36, an inductor 38, and a capacitor 40, which are each connected between terminal 20 and ground. The capacitor 40 is shown connected between terminal 30 and ground by dashed lines. This is so because the capacitor 40 in this circuit arrangement represents the self-capacity of inductor 38 and the inter-electrode capacity of the collector circuit of transistor $T_1$. It is to be understood of course that in certain circuit arrangements an actual capacitor may be utilized in parallel arrangement with inductor 38 without departing from the spirit and scope of the present invention.

A series connected switching and blocking diode 42 and resistor 44 are connected in parallel to the LRC network 10. This is provided by connecting the cathode of diode 42 to terminal 20, connecting the anode of diode 42 to one end of resistor 44 and connecting the other end of resistor 44 to ground. A biasing voltage +E for normally biasing the diode 42 in a normally conductive start is provided by connecting the source +E directly to junction terminal 43 via a voltage limiting resistor 46. A second switching and blocking diode 48 is connected in series to the LRC network 10. This is provided by connecting the anode of diode 48 to terminal 20 and the cathode of diode 48 to output terminal 50. A bias voltage −E for biasing the diode 48 in a normally conductive state is provided by connecting the source −E directly to junction terminal 53 via limiting resistor 54.

An output load resistor 56 is connected between terminal 53 and ground; thus, the output signal of the circuit of FIG. 1 is taken across terminals 50 and 52 which are directly across the output load 56. The series resistors 44–46 and series resistors 54–56 advantageously prevent cross-over distortion from occurring when diode 42 and diode 48, respectively, switch their conductive states, such as occurs at times $t_2$, $t_5$ and $t_8$.

It should be noted at this point that in order to load the output circuit of transistor $T_1$ so that the operation of the circuit is not sensitive to variations in the Q of the inductor 38, the resistor 36 is provided to shunt the inductor 38. This specific circuit arrangement for providing inductor sensitivity is not per se critical to the present invention. Accordingly, any other well known technique for preventing inductor sensitivity may be incorporated herein without departing from the spirit and scope of the present invention.

*Mode of operation*

At time $t_0$, the voltage signals present at terminals 20, 22 and 50 are shown in FIG. 2. At this time, the transistor $T_1$ is normally conducting in a substantially steady state so that the LRC network 10 is charged to some predetermined condition and the diodes 42 and 48 are in their normally conductive states, thereby providing substantially no output signal across the load resistor 56.

At time $t_1$, an input pulse is coupled to input terminal 22, which pulse may be a half-sine wave, as shown in waveform 58 of FIG. 2. This causes the conduction of transistor $T_1$ to reduce but does not shut off the transistor because it is connected in class A operation. During the time interval $t_1$–$t_2$ the change in collector current of the transistor $T_1$ shock excites the LRC network 10, such as shown by waveform 60 of FIG. 2. During this time interval, the varying energy to the LRC network 10 is completely supplied by the transistor $T_1$, and although the diode 42 is conducting it is not possible for the network 10 to discharge through the parallel path provided by diode 42 and resistor 44. It will be apparent, of course, that although the bias voltage −E normally conditions diode 48 into its conductive state, it is insufficient to hold the diode 48 in this state when the waveform 60 falls below a predetermined negative voltage.

Four purposes of explanation only, the voltage appearing at terminals 43 and 53 are preferably mere fractions of a volt, such as .1 to .3 volt D.C. Thus, when wave form 60 falls below the low voltage at terminal 53 diode 48 will be biased in its nonconducting state and will not pass any negative excursions of the waveform 60.

At time $t_2$ when the waveform 58 returns to its normal voltage level, such as "0" volts, the LRC network 10 will ring or oscillate as shown by waveform 60. During the time interval $t_2$–$t_3$ the positive excursions of waveform 60 will pass through diode 48 and be seen across load resistor 56, as shown by waveform 62 of FIG. 2. However, although the bias voltage +E normally conditions diode 42 to be in its conductive state, it is of insufficient voltage level, such as .1–.3 volt D.C., so that diode 42 will be driven into its non-conductive state when waveform 60 exceeds the voltage at terminal 43. Thus, diode 42 will not pass any positive excursions of waveform 60.

At time $t_3$, the LRC network 10 tends to ring or oscillate again and if this network was undamped the waveform 60 would appear as shown by the dashed lined waveform 64 of FIG. 2. However, since the LRC network 10 is no longer receiving energy from transistor $T_1$, the shunting diode 42 and resistor 44 quickly discharge or "dump" the energy stored in the LRC network 10. The circuit is now in the same operating condition at time $t_4$ as it was at time $t_1$ and consequently in ideal condition to receive another input pulse.

As should now be apparent to one skilled in the art, diode 42 and resistor 44 can "dump" or short the energy of the tank circuit 38–40 quite rapidly because of the difference in the impedance of the driving sources. On the initial network excursion the driving impedance of the transistor $T_1$ is very low with respect to the combined diode 42 and resistor 44. For instance, the driving impedance of transistor $T_1$ might be $1/10$ of the resistance of diode 42 and resistor 44. After the transistor $T_1$ stops driving at points $t_2$ of FIGURE 2, the tank circuit 38–40 will commence to drive the circuit. The first or positive excursion of the tank circuit will be blocked entirely by the diode 42 but will pass through diode 48. The driving source for the second or negative excursion is again the energy stored in tank circuit 38–40 whose impedance is proportional to the value of the inductor 38. Inductor 38 is chosen with a very high impedance with respect to the combined resistance of diode 42 and resistor 44. For instance the driving impedance might now be 10 times the resistance of diode 42 and resistor 44. This new high impedance driving source cannot maintain the sinusoidal voltage waveform and the diode 42 and resistor 44 quickly short the voltage waveform to zero. This shorting action occurs very rapidly after point $t_3$ of FIGURE 2 and the circuit may receive another pulse within $1/20$ of the distance between $t_3$–$t_4$.

It should be noted at this point that the output pulse of waveform 62 occurring at time interval $t_2$–$t_3$ is identical to the input pulse of waveform 58 coupled to the input terminal 22 during time interval $t_1$–$t_2$. In this instance the output pulse is a half-sine wave as is the input pulse and is delayed one interval of time. It is to be further understood at this point that the specific delay of the output pulse with respect to the input pulse will depend upon the specific values of the LRC network 10, since it is the leading edge of the input pulse that shock excites the network 10 and causes it to ring or oscillate. By way of example, a detailed mode of operation when a distorted pulse, such as that shown in waveform 58 at time interval $t_4$–$t_5$, is applied to input terminal 22 follows:

At time $t_4$, the distorted pulse causes the conduction of transistor $T_1$ to decrease; however, LRC network 10 is again shock excited and begins to ring or oscillate as shown by the solid lines of waveform 60 between time interval $t_4$–$t_6$. As above stated, the negative excursions of waveform 60 during the time interval $t_4$–$t_5$ will be blocked by diode 48, but since transistor $T_1$ is supplying energy to network 10 during time interval $t_4$–$t_5$ the diode 42 cannot discharge or "dump" the energy from the network 10. However, at time $t_5$ when the waveform 58 falls to a low level such as "0" volts, the network 10 rings as shown by waveform 60 during time interval $t_5$–$t_6$. Again, diode 48 will pass the positive excursions of waveform 60, which will be seen across load resistor 56, and the diode 42 will block or prevent the positive excursions from shorting or passing to ground. Thus, the pulse of waveform 62 as shown during $t_5$–$t_6$ will appear across terminals 50 and 52. When the network 10 attempts to ring or oscillate again the diode 42 and resistor 44 will rapidly discharge or "dump" the energy stored in network 10, as shown by waveform 60 during time interval $t_6$–$t_7$. It will again be noted that in the absence of diode 42, i.e., the network 10 is undamped, the network 10 would ring or oscillate such as shown by the dashed lined waveform 66 during time interval $t_6$–$t_7$.

Again for exemplary purposes only, the active delay circuit of FIG. 1 will advantageously operate to delay a pulse of energy a predetermined amount when a square wave is coupled to the input terminal 22, such as shown in waveform 58 during time interval $t_7$–$t_8$. During time $t_7$–$t_{10}$ the operation of the network 10 and switching or blocking diodes 42 and 48 is the same as described above when a half-sine wave is applied to terminal 22, and it is therefore not considered necessary to describe in detail the waveforms 60 and 62 during time interval $t_7$–$t_{10}$. It will suffice to state, however, that the waveform 60 and 62 will be substantially the same during time interval $t_7$–$t_{10}$ as it was during time intervals $t_1$–$t_4$ and $t_4$–$t_7$.

It will be noted at this point that the period and shape of waveform 60 and 62 are not dependent upon the shape of the pulse of waveform 58 which is coupled to the input terminal 22. It should be further noted that the diode 42 does not discharge or prevent charging of the LRC network 10 when the transistor $T_1$ is operating as a variable energy source. However, after the input signal 58 falls to a low level or "0" volts as shown in time intervals $t_2$–$t_4$, $t_5$–$t_7$ and $t_8$–$t_{10}$, the network 10 itself supplies all the energy when it is ringing or oscillating. Thus, the diode 42 is capable of discharging or "dumping" the remaining stored energy in network 10. Diode 42, therefore, advantageously enhances the recovery time of the LRC network 10 and uniquely prevents distortion of subsequent input pulses due to residual unwanted energy which would be present in the network 10 if it were not rapidly discharged.

It will be apparent to those skilled in the prior art that the active delay circuit of the present invention may be advantageously connected in a cascaded circuit arrangement for producing any desired amount of delay.

Modifications of the delay circuit shown in FIGURE 1 may be made. The inductor 7 may be tuned to a specific frequency by paralleling it with an actual capacitor. This insures very accurate waveform reproduction and essentially single frequency operation. Output pulses of a constant width and shape are attained.

Also, an inductor may be connected between the emitter of transistor $T_1$ and the resistor 18. This inductor will delay the start and decrease the slope of the voltage waveform at the collector of transistor $T_1$ as the voltage changes from the most negative to the most positive level.

Further wave shaping may be made when the transistor $T_1$ drives a nonresonant load, by means of a parallel LC circuit connected between the output terminal 50 and the negative voltage.

While a particular embodiment of the invention has been shown and described, it will, of course, be understood that various other modifications may be made without departing from the principles of the invention. The appended claims are, therefore, intended to cover any such modifications within the true spirit and scope of the invention.

I claim:

1. An active delay device having a high input impedance and a low output impedance for providing an output signal which is delayed a predetermined period with respect to the input signal and has a predetermined width independent of the width of said input signal, said device comprising:

(a) a transistor having base, emitter and collector circuits and an output load resistor connected across said collector circuit;

(b) a reactive load connected to said collector circuit in parallel to said output load resistor;

(c) means for applying an input signal to the base of said transistor;

(d) means for biasing said transistor to class A operation so that energy is provided to said reactive load when said input signal is coupled to said base circuit so as to shock excite said reactive load and produce a voltage signal across said reactive load;

(e) said voltage signal having voltage excursions of one polarity and voltage excursions of another polarity;

(f) a first diode connected across said reactive load and being poled so as to pass said voltage excursions of one polarity and block said voltage excursions of another polarity;

(g) a second diode series connected between said reactive load and said output load resistor and being poled so as to block said voltage excursions of another polarity and pass said voltage excursions of on polarity; and (h) said first diode being further adapted to pass said voltage excursions of one polarity when said input signal is coupled to said base circuit and, whereby said first diode will short said voltage excursions of one polarity only when said input signal is decoupled from said base circuit.

2. The delay device recited in claim 1 herein said reactive load is an inductor.

3. An active delay device in accordance with claim 1, wherein:

(a) said first and second diodes are forwardly biased so as to be normally conducting;

(b) said first diode has its cathode connected to said collector circuit and its anode connected to ground;

(c) said second diode has its anode connected to the cathode of said first diode and its cathode connected to one end of said load resistor; and (d) said load resistor has its other end connected to ground.

4. An active delay device in accordance with claim 3, wherein:

(a) said output signal is delayed a predetermined period with respect to the leading edge of said input signal; and (b) said output signal has a predetermined width which is dependent upon the reactance of said reactive load.

5. An active delay device having a high input impedance and a low output impedance for providing an output pulse which is delayed a predetermined period with respect to the leading edge of the input pulse and has a predetermined width independent of the width of said input pulse, said device comprising:

(a) a transistor having a base, an emitter and a collector electrode and an output load resistor;

(b) a reactive load connected directly to said collector in parallel to said output load resistor;

(c) means for applying an input signal to the base of said transistor;

(d) means for biasing said transistor so as to provide energy to said reactive load when said input pulse is applied to said base so as to shock excite said reactive load and produce a voltage signal across said reactive load;

(e) said voltage signal having a negative excursion followed by a positive excursion;

(f) a first diode having its cathode connected to said collector and its anode connected to ground so as to pass only negative excursions of said voltage signal;

(g) a second diode having its anode connected to said collector and its cathode connected to one end of said load resistor so as to pass only positive excursions of said voltage signal;

(h) said load resistor having its other end connected to ground; and (i) said transistor being connected in the device so as to be in class A operation so that when said input pulse is applied to said base said first diode will pass said negative voltage excursions of said voltage signal and, whereby said first diode will short said negative excursions only when said input pulse is decoupled from said base.

6. The delay device recited in claim 5 wherein the said reactive load is an inductor.

References Cited by the Examiner

UNITED STATES PATENTS

| | | | |
|---|---|---|---|
| 2,443,619 | 6/1948 | Hopper | 328—223 X |
| 2,594,336 | 4/1952 | Mohr | 307—88.5 X |
| 2,875,336 | 2/1959 | Williams | 328—223 |
| 2,914,683 | 11/1959 | Terry | 307—88.5 |
| 2,924,724 | 2/1960 | Booker | 307—88.5 |
| 2,971,164 | 2/1961 | Soari | 328—171 X |
| 3,011,066 | 11/1961 | Vogelsong | 307—885 |
| 3,047,734 | 7/1962 | Johnson | 307—88.5 |
| 3,076,103 | 1/1963 | Bianchi | 307—88.5 |

ARTHUR GAUSS, *Primary Examiner.*

DAVID J. GALVIN, *Examiner.*

J. JORDAN, *Assistant Examinar.*